United States Patent [19]

Matsuo et al.

[11] Patent Number: 5,519,394
[45] Date of Patent: May 21, 1996

[54] CODING/DECODING APPARATUS AND METHOD

[75] Inventors: Naoshi Matsuo; Naoji Fujino; Mitsuru Tsuboi, all of Kawasaki; Toshiaki Nobumoto; Nobuhide Eguchi, both of Fukuoka, all of Japan

[73] Assignee: Fujitsu Limited, Kawasaki, Japan

[21] Appl. No.: 278,615

[22] Filed: Jul. 21, 1994

[30] Foreign Application Priority Data

Jan. 11, 1994 [JP] Japan ........................... 6-001253

[51] Int. Cl.⁶ ..................... H04L 17/18; H04L 15/28; H03M 13/02
[52] U.S. Cl. ............................. 341/51; 395/2.29
[58] Field of Search ....................... 341/51, 50, 76, 341/106, 200; 395/2, 2.13, 2.12, 2.28, 2.3–2.32, 2.39, 2.29, 2.67, 2.71; 381/29–40

[56] References Cited

U.S. PATENT DOCUMENTS

| | | | |
|---|---|---|---|
| 4,817,157 | 3/1989 | Gerson | 381/40 |
| 5,034,965 | 7/1991 | Kato | 375/26 |
| 5,265,190 | 11/1993 | Yip | 395/2.28 |
| 5,323,486 | 6/1994 | Taniguchi | 395/2.31 |

*Primary Examiner*—A. D. Pellinen
*Assistant Examiner*—Peguy JeanPierre

[57] ABSTRACT

The coder generates code information $A_1$–$A_N$, each representing one of Q quantization points of an input signal, where Q is an integer equal to or less than $2^X$ and X is a positive number, synthesizes the code information $A_1$–$A_N$ into a code H through an operation:

$$H = A_1 Q^{N-1} + A_2 Q^{N-2} + \ldots + A_{N-1} Q + A_N,$$

and outputs the code H. The decoder inputs the code H, separates the code H into code information $A_1$–$A_N$ through operations with decimal fractions of quotients truncated:

$$A_1 = H/Q^{N-1}$$

$$A_2 = (H - A_1 Q^{N-1})/Q^{N-2}$$

$$A_{N-1} = (H - A_1 Q^{N-1} - A_2 Q^{N-2} - \ldots - A_{N-2} Q^2)/Q$$

$$A_N = H - A_1 Q^{N-1} - A_2 Q^{N-2} - \ldots - A_{N-2} Q^2 - A_{N-1} Q,$$

and reproduces an output signal based upon the thus-separated code information $A_1$–$A_N$.

14 Claims, 9 Drawing Sheets

| CODE INFO A1 | CODE INFO A2 | SYNTHESIZED CODE INFO H |
|---|---|---|
| 0 | 0 | 0 |
| 0 | 1 | 1 |
| 0 | 2 | 2 |
| ⋮ | ⋮ | ⋮ |
| 0 | 361 | 361 |
| 1 | 0 | 362 |
| 1 | 1 | 363 |
| 1 | 2 | 364 |
| ⋮ | ⋮ | ⋮ |
| 1 | 361 | 723 |
| 2 | 0 | 724 |
| 2 | 1 | 725 |
| 2 | 2 | 726 |
| ⋮ | ⋮ | ⋮ |
| 2 | 361 | 1085 |
| ⋮ | ⋮ | ⋮ |
| 361 | 0 | 130682 |
| 361 | 1 | 130683 |
| 361 | 2 | 130684 |
| ⋮ | ⋮ | ⋮ |
| 361 | 361 | 131043 |

FIG. 6

CODING/DECODING APPARATUS AND METHOD

BACKGROUND OF THE INVENTION

1. Field of the Invention

The present invention relates to a coding/decoding apparatus and method, or more particularly to an apparatus and method for coding a signal such as digital-encoded information of voice and image signals into code information and decoding vice versa.

In general, code information, which is generated for each quantization point in vector quantization method, for example, is transmitted over a transmission line (hereinafter the term line may imply transmission facilities including a communication control unit, modem and transmission line) having a predetermined transmission rate, along with frame synchronizing signals and overhead information. Therefore, the practical transmission rate available for transmission of the rode information per se is usually lower than the actual transmission rate.

Also, the rode information may be stored in a predetermined length of a storage area of an external memory (e.g., magnetic disk), along with other information (e.g., a error cheek and correction bit). Therefore, the practical length of a storage area available for storing the rode information is usually smaller than the actual length of the storage area.

For the above reason, the average number of code-information bits required for expressing the whole quantization points may not be an integer.

Let's assume that the average number of code-information bits required for expressing the whole quantization points is 8.5 bits, for example. If 9 bits of code information is generated each time, it is impossible to transmit or record the code information without loss of the information. Also, if 8 bits of code information is generated each time, the number of code-information bits given cannot be utilized fully and the system resources (i.e., transmission line and external memory) cannot be used effectively and efficiently.

Therefore, a coding/decoding apparatus and method, which can achieve the optimum coding/decoding and utilize such system resources effectively and efficiently, is in great demand.

2. Description of the Related Art

FIG. 1 is a block diagram illustrating a coding/decoding method of the related art.

A coding device 40, which codes a speech signal into code information using a vector quantization method, is comprised of a coder 7 and a transmitter (abbreviated to XMTR) 5. The coder 7 is comprised of a code book (abbreviated to CB) $7_1$, a multiplier $7_2$, an adaptive predictor (abbreviated to AP) $7_3$ of gain g, a speech-synthesis filter (abbreviated to F) $7_4$, an adaptive predictor (AP) $7_5$ of synthetic filter coefficients $a_1$-$a_p$, a subtracter $7_6$ and a coding controller $7_7$.

A decoding device 50, which decodes the code information into the speech signal using a vector quantization method, is comprised of a receiver (abbreviated to RCVR) 6 and a decoder 8. The decoder 8 is comprised of a code book (CB) $8_1$ which has the same construction as the above code book $7_1$, a multiplier $8_2$, an adaptive predictor (AP) $8_3$ of gain g, a speech-synthesis filter (F) $8_4$, and an adaptive predictor (AP) $8_5$ of synthetic filter coefficients $a_1$-$a_p$.

In the coder 7, the coding controller $7_7$ extracts a particular speech drive signal series $c_n$ (hereinafter called a code vector) from the code book $7_1$ and generates a reproduction speech signal series $x_n$. Then, the coding controller $7_7$ calculates an error electric power E relative to an input speech signal series $y_n$, evaluates the error electric power E and searches the code book $7_1$ for a code vector $c_n$ which causes the reproduction speech signal series $x_n$ to minimize the error electric power E. The coding controller $7_7$ then reads an index A corresponding to the code vector from code book $7_1$ and transmits the index A to the decoding device 50 as code information. (Although the code information includes other data such as the filter coefficient, an example of transmitting only the index A as code information is explained here for easy understanding.)

Based on the received code information A, the decoder 8 reproduces the same reproduction speech signal series $x_n$ as that which was evaluated by the coder 7 as minimizing the error electric power E.

FIG. 2 is a timing chart illustrating a coding/decoding method of the related art. An example of coding/decoding of speech signal by using the vector quantization method is shown here.

The coder 7 generates the code information A for every 5 samples of the speech signal $y_n$ and transmits the code information A over the line 30 at a practical transmission rate of 13.6 k (k=1000) bps. (Even if the actual transmission speed is 16 k bps, the practical transmission speed available for transmission of the code information A may be 13.6 k bps, because, as mentioned above, frame synchronous signals and overhead information are inserted therein.)

When the speech signal is sampled every 125 micro-seconds (i. e., at a sampling frequency of 8k Hz), the period required for 5 samplings is 625 micro-seconds. Thus, 8.5 bits of code information A can be transmitted in the period of 625 micro seconds. Actually, only integral bits of information can be transmitted over the transmission line 30, though.

Therefore, a conventional method transmitted 8 bits of code information $A_1$ and 9 bits of code information $A_2$ alternately in first and second phases, respectively, as shown in FIG. 2. To transmit 9 bits of code information $A_2$, coder 7 (See FIG. 1) required additional code book $7_1$ having 512 (=$2^9$) code vector, for example. Accordingly, the coding controller $7_7$ generated 8-bit code information $A_1$ by scanning the first half ($2^8$=256) of the code book $7_1$ in the first phase and 9-bit code information $A_2$ by scanning the whole code book $7_1$ in the second phase. Or, the coder 7 had two separate code books (not shown in the figure) having 256 code vectors and 512 code vectors optimized for generating 8-bit code information $A_1$ and 9-bit code information $A_2$, respectively. Then, the coding controller $7_7$ selectively scanned the two code books according to the phase.

However, a problem is that the above methods using a plurality of code books require a large amount of memory capacity for the code books and a large amount of circuitry associated therewith, for switching the code books, for example.

Another problem is that the above code book $7_1$, whose first half and the whole are scanned alternately for obtaining the code information, cannot be optimized for both 8-bit code information $A_1$ and 9-bit code information $A_2$. That is, the code book $7_1$ optimized for generating 9-bit code information $A_2$ cannot be optimized for the 8-bit code information $A_1$. The same is true with the code book $7_1$ optimized for 8-bit code information $A_1$, i.e. it cannot be optimized for the 9-bit code information $A_2$.

Still another problem is that there is a problem with accuracy in the operation of the above gain g, speech-synthesis filter coefficient $a_1$–$a_p$, and error electric power E. That is, to execute the operation with most accuracy in fixed-point arithmetic, for example, it is desirable to use the full bits (e.g., 16 bits) of a machine word of a processor (e.g., Digital Signal Processor).

If operand data is normalized on an 8-bit basis to generate 8-bit code information $A_1$ so that an operation may not cause an overflow (in which a carry occurs from the most significant bit position into the sign bit position exceeding the decimal point), an operation for generating 9-bit code information $A_2$ may cause an overflow. The same is true with the reverse ease in which normalization is conducted on an 9-bit basis. Thus, in order to simplify and speed up the operations, it is required to perform the operations either on an 8-bit or 9-bit basis, eventually decreasing the accuracy of operation.

SUMMARY OF THE INVENTION

It is an object of the present invention to provide a coding/decoding apparatus and method which can achieve the optimum coding/decoding even with external limitations.

It is another object of the present invention to provide a coding/decoding apparatus and method which can utilize system resources such as a transmission line and an external memory effectively and efficiently.

It is still another object of the present invention to provide a coding/decoding apparatus and method which requires a small amount of circuitry or program and therefore, is economical.

To achieve the above and other objects, the present invention provides generation means, synthesis means, output means, input means, separation means and reproduction means.

In a coding apparatus, the generation means generates N sets of code information $A_1$–$A_N$, each representing one of Q quantization points of an input signal, where Q is an integer equal to or less than $2^x$ and X is a positive number. The synthesis means synthesizes the code information $A_1$–$A_N$ into a synthesized code H through an operation:

$$H = A_1 Q^{N-1} + A_2 Q^{N-2} + \ldots + A_{N-1} Q + A_N.$$

The output means outputs the synthesized code H to the output means.

In a decoding apparatus, the input means inputs the synthesized code H. The separation means separates the synthesized code H into N sets of code information $A_1$–$A_N$ through following operations, with decimal fractions of quotients truncated:

$$A_1 = H/Q^{N-1}$$

$$A_2 = (H - A_1 Q^{N-1})/Q^{N-2}$$

.
.
.

$$A_{N-1} = (H - A_1 Q^{N-1} - A_2 Q^{N-2} - \ldots - A_{N-2} Q^2)/Q$$

$$A_N = H - A_1 Q^{N-1} - A_2 Q^{N-2} - \ldots - A_{N-2} Q^2 - A_{N-1} Q.$$

The reproduction means reproduces an output signal based upon the code information $A_1$–$A_N$ separated.

BRIEF DESCRIPTION OF THE DRAWINGS

FIG. 6 shows a combination of the code information which are input as an address to a ROM;

Throughout the above-mentioned drawings, identical reference numerals are used to designate the same or similar component parts.

DESCRIPTION OF THE PREFERRED EMBODIMENTS

Figure 1:
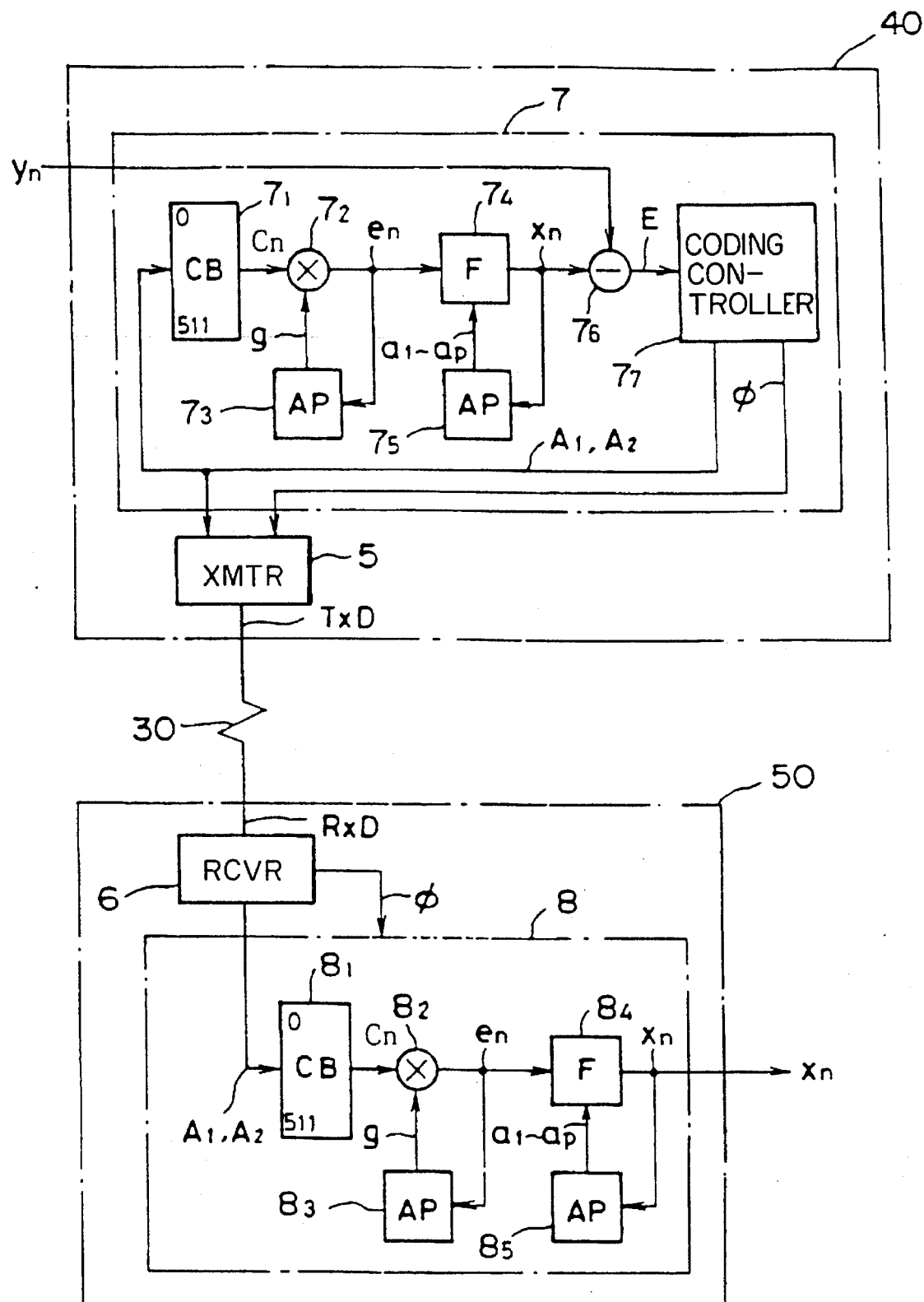
FIG. 1 is a block diagram illustrating a coding/decoding method of the related art.
Figure 2:
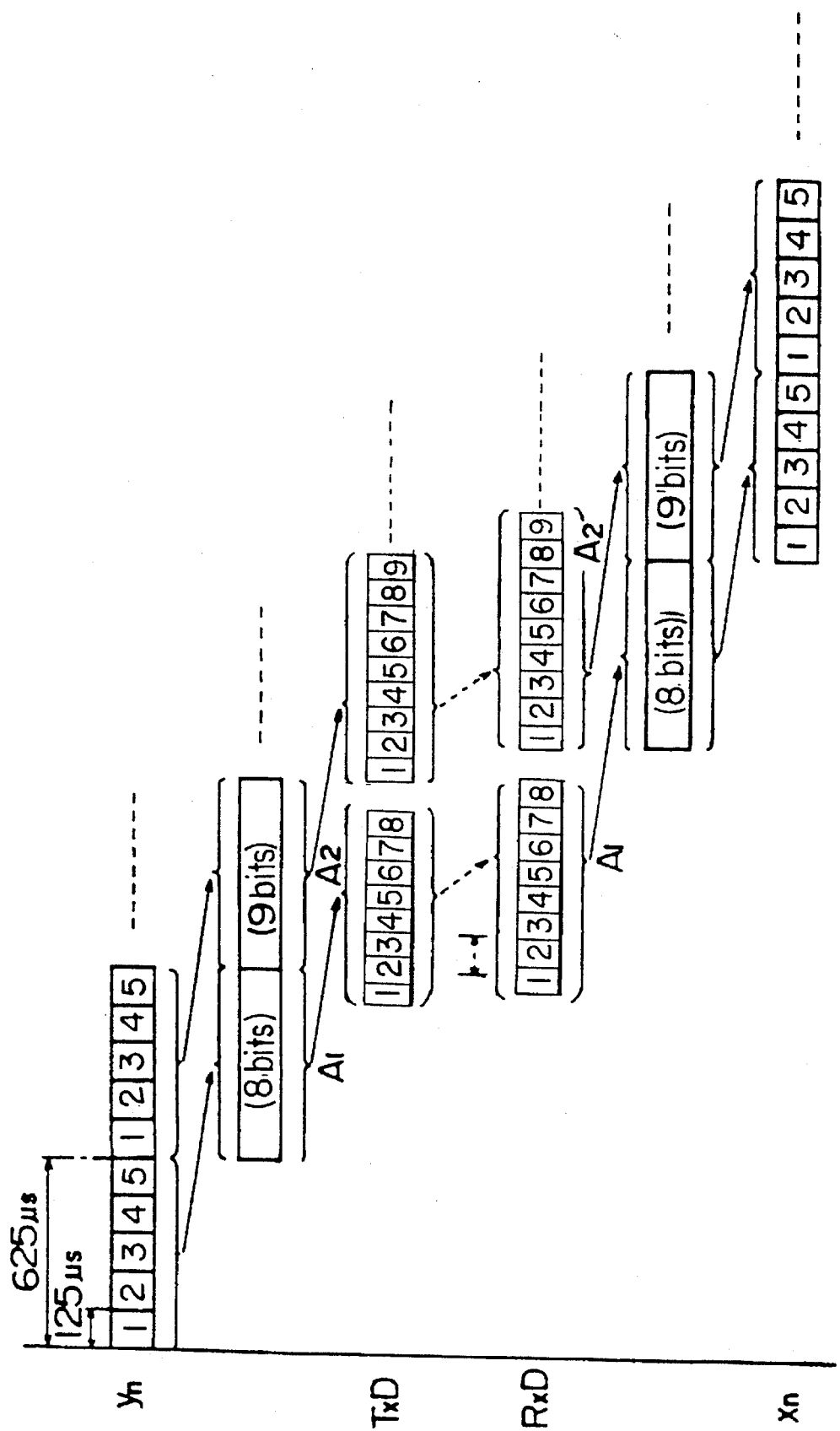
FIG. 2 is a timing chart illustrating a coding/decoding method of the related art.
Figure 3:
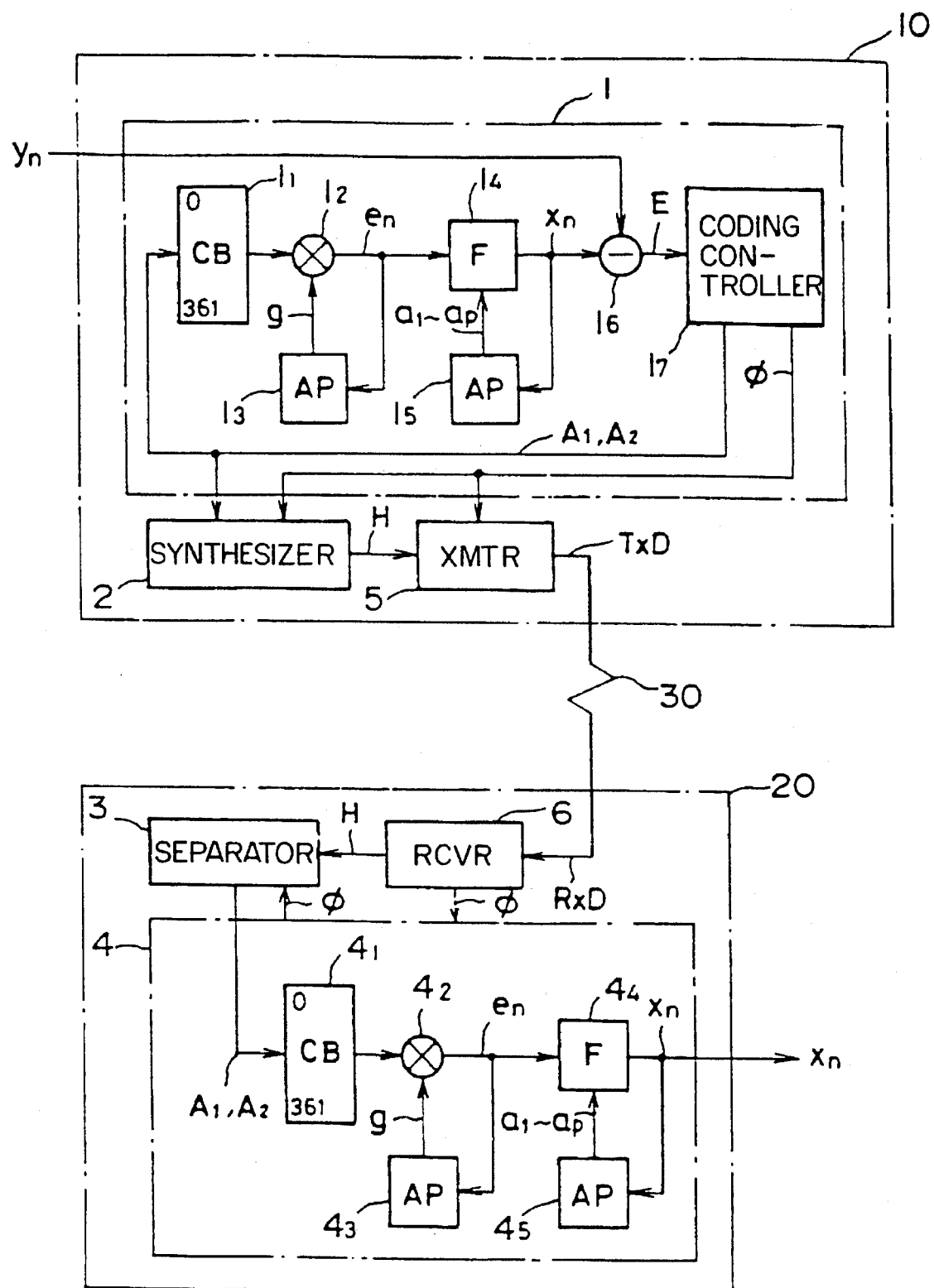
FIG. 3 is a block diagram illustrating a coding/decoding apparatus of the first embodiment of the present invention.

FIG. 3 is a block diagram illustrating a coding/decoding apparatus of the first embodiment of the present invention. A method of coding/decoding speech signals using the known vector quantization method is explained here as an example.

A coding device 10 is comprised of a coder 1, a synthesizer 2 and a transmitter (abbreviated to XMTR) 5. The coder 1 is comprised of a code book (abbreviated to CB) $1_1$, a multiplier $1_2$, an adaptive predictor (abbreviated to AP) $1_3$ of gain g, a speech-synthesis filter (abbreviated to F) $1_4$, an adaptive predictor (AP) $1_5$ of synthetic filter coefficients $a_1$–$a_p$, a subtracter $1_6$ and a coding controller $1_7$. The code book (CB) $1_1$ includes as many code vectors (i.e., optimized speech driving source signal series) as the maximum integer equal to or less than $2^{8.5}$ (i.e., 362 code vectors).

The decoding device 20 is comprised of a receiver (abbreviated to RCVR) 6, a separator 3 and a decoder 4. The decoder 4 is comprised of a code book (CB) $4_1$ which is the same as the above-mentioned code book $1_1$, a multiplier $4_2$, an adaptive predictor (AP) $4_3$ of gain g, a speech-synthesis filter (F) $4_4$, and an adaptive predictor (AP) $4_5$ of synthetic filter coefficients $a_1 a_p$. In the coder 1 of the coding device 10, the coding controller $1_7$ selects a particular speech drive signal series (code vector) $c_n$ from the code book $1_1$ and generates a reproduction speech signal series $x_n$. The coding controller $1_7$ calculates an error electric power E relative to an input speech signal series $y_n$, evaluates the error electric power E and searches the code book $1$, for a code vector $c_n$ which causes the reproduction speech signal series $x_n$ to minimize the error electric power E.

The coding controller $1_7$ then reads an index A corresponding to the code vector from code book $1_1$ and transmits the index A to the decoding device 20 as code information. (Although the code information includes other data such as the filter coefficient, an example of transmitting only the index A as code information is explained here for easy understanding.)

The synthesizer 2 buffers a pair of code information $A_1$ and $A_2$ output from the coder 1 and performs the following operation on the buffered code information $A_1$ and $A_2$:

$$H = A_1 \times 362 + A_2$$

Thus, the synthesizer 2 synthesizes a pair of the code information $A_1$ and $A_2$ into a 17-bit code H and transmits the synthesized code information H over the transmission line 30 through the transmitter 5.

In decoding device 20, the receiver 6 receives the 17-bit synthesized code information H and supplies it to the separator 3.

The separator 3 buffers the code H and performs the following operations on the H, with a decimal fraction of a quotient truncated:

$$A_1 = H \div 362$$

$$A_2 = H - A_1 \times 362$$

Thus, the separator 3 extracts a pair of the original code information $A_1$ and $A_2$ separately from the 17-bit synthesized code information H. Based on the code information $A_1$ and $A_2$ thus-separated, the decoder 4 reproduces the original reproduction speech signal series $x_n$, for which the error electric power E is evaluated by the coder 1 as the minimum.

Figure 4:
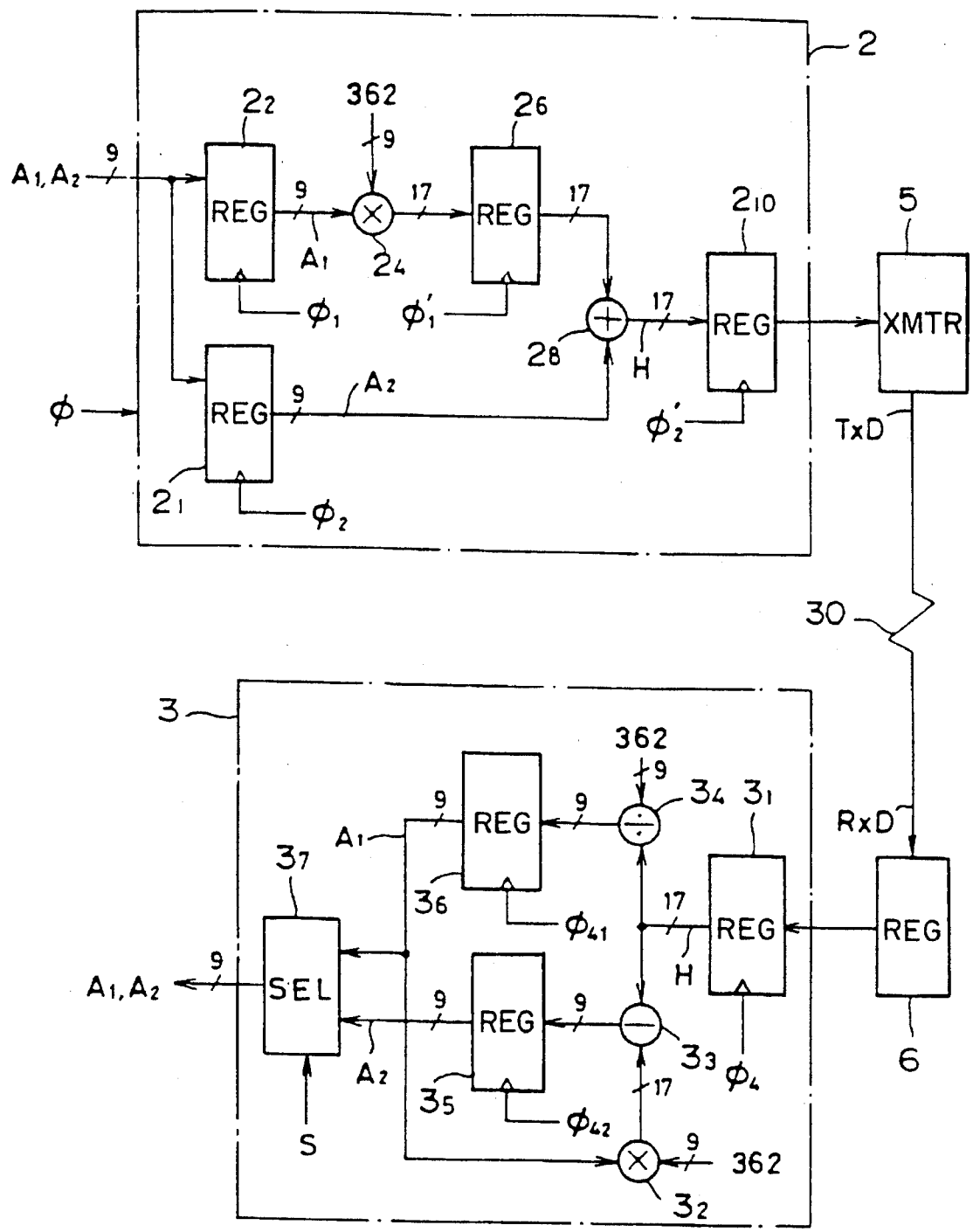
FIG. 4 is a block diagram illustrating the synthesizer and the separator of the first embodiment of the present invetion.

FIG. 4 is a block diagram illustrating the synthesizer and the separator of the first embodiment of the present invention.

The synthesizer 2 is comprised of registers (abbreviated to REG) $2_1$, $2_2$, $2_6$, $2_{10}$, a multiplier $2_4$ and an adder $2_8$. The separator 3 is comprised of registers $3_1$, $3_5$ and $3_6$, a multiplier $3_2$, subtracter $3_3$, divider $3_4$ and selector (abbreviated to SEL) $3_7$. FIG. 4 also shows the number of bits included in each signal bus.

In the synthesizer 2, the first code information $A_1$ generated by the coder 1 is loaded into the register $2_2$ with a clock pulse $\phi_1$ which occurs in synchronization with generation of the code information $A_1$. Then, the multiplier $2_4$ multiplies the output ($A_1$) of the register $2_2$ by 362. The multiplication result ($A_1 \times 362$) is loaded into register $2_6$ with a clock pulse $\phi_1'$ which occurs following the clock pulse $\phi_1$. The next code information $A_2$ generated by the coder 1 is loaded into the register $2_1$ with a clock pulse $\phi_2$ which occurs in synchronization with generation of the code information $A_2$. Then, the adder $2_8$ adds the output ($A_1 \times 362$) of register $2_6$ to that ($A_2$) of register $2_1$.

The addition result ($H = A_1 \times 362 + A_2$) is loaded into the register $2_{10}$ with a clock pulse $\phi_2'$ which follows the clock pulse $\phi_2$. The output of the register $2_{10}$ is transmitted to the transmitter 5 as synthesized code information H. Thereafter, every time a pair of code information $A_1$ and $A_2$ are input, the above operation is repeated.

In the separator 3, the synthesized code information H input via the receiver 6 is loaded into the register $3_1$ with a clock pulse $\phi_4$ which occurs in synchronization with the input of the H.

Then, the divider $3_4$ divides the output (H) of the register $3_1$ by 362 to obtain a result $A_1$ (with the decimal fractions of the quotient truncated). The division result $A_1$ is loaded into the register $3_6$ with a clock pulse $\phi_{41}$ following the clock pulse $\phi_4$.

Thereafter, the multiplier $3_2$ multiplies the output ($A_1$) of the register $3_6$ by 362.

Next, the subtracter $3_3$ subtracts the output ($A_1 \times 362$) of the multiplier $3_2$ from the output (H) of the register $3_1$ to obtain $A_2 (= H - A_1 \times 362)$. The subtraction result $A_2$ is loaded into register $3_5$ with a clock pulse $\phi_{42}$ following the clock pulse $\phi_{41}$.

Thus, the synthesized code information H received is separated into the original code information $A_1$ and $A_2$.

The selector $3_7$ selects the thus-separated code information $A_1$ and $A_2$ using a selection signal S which occurs in synchronization with the above decoding operation, and supplies the $A_1$ and $A_2$ sequentially to the decoder 4. Thereafter, every time the synthesized code information H is input, the above operations are repeated.

Figure 5:
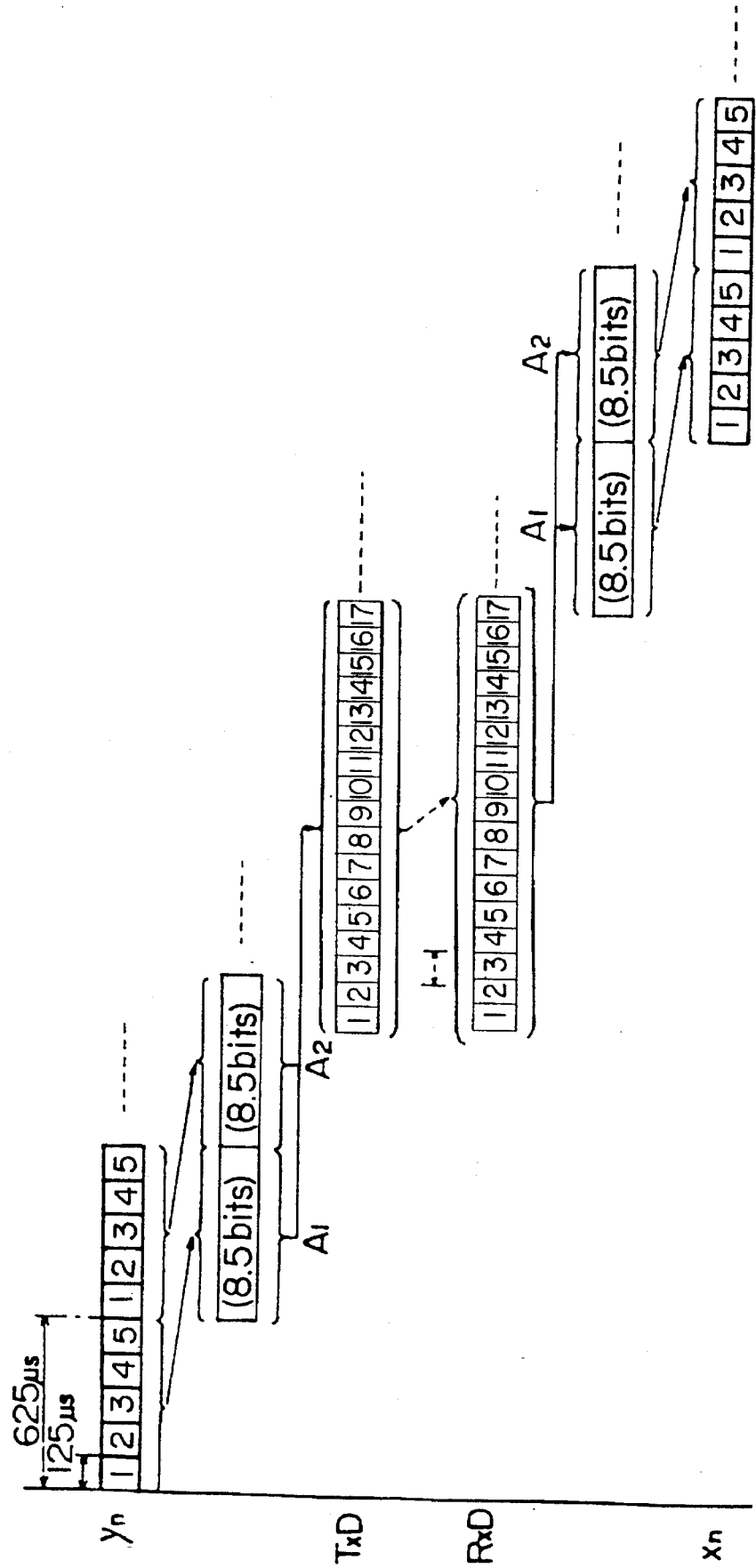
FIG. 5 is a timing chat illustrating the coding/decoding method of the first embodiment of the present invention.

FIG. 5 is a timing chart illustrating the coding/decoding method of the first embodiment of the present invention.

A speech signal $y_n$ is sampled at a sampling frequency of 8 kHz. The coder 1 performs vector-quantization in units of 5 samples and generates the code information $A_1$ and $A_2$, each having a binary value that can be expressed by 8.5 bits. The synthesizer 2 synthesizes the code information $A_1$ and $A_2$ into a code H consisting of a total of 17 bits. The transmitter 5 transmits the 17-bit synthesized code information H (TxD) bit-serially over the transmission line 30 which has a practical transmission speed of 13.6 k bps as explained above.

In the meanwhile, the separator 3 separates the 17 bit-synthesized code information H (RxD) received by the receiver 6 into a pair of code information $A_1$ and $A_2$, each having a binary value that can be expressed by 8.5 bits and supplies the $A_1$ and $A_2$ to the decoder 4. The decoder 4 searches the code book $4_1$ for the code vectors according to the code information $A_1$ and $A_2$, and reproduces reproduction speech signal series xn based on the code vector found.

Thus, in a system in which the avarage number of code-information bits required for expressing the whole quantization points is 8.5, the present invention can always provide a coding/decoding apparatus and method, which can achieve optimized coding/decoding by increasing the entries of the code book (e.g., from 256 to 362) and utilize such system resources as transmission line and external memory, most effectively and efficiently.

In the above example, the synthesizer 2 and the separator 3 perform the synthesis and separation operations in real time through the numerical formulas by using circuits such as registers, adders, subtracters, multipliers and dividers. Instead, those operations may be performed by using a conversion table provided in a storage device (RAM or ROM) which has the above-mentioned operation results previously stored.

FIG. 6 shows a conversion table for converting code information. The conversion table in FIG. 6 shows an example in which the average number of code-information bits required for expressing the whole quantization points is 8.5. The table can be configured in the same way with other number of code information bits.

In the synthesizer 2, a combination of the code information $A_1$ and $A_2$ are input as an address to a ROM (not shown in FIG. 4) having a conversion table as shown in FIG. 6 stored. The ROM reads out synthesized code information H corresponding to the combination of code information $A_1$ and $A_2$ from the conversion table.

In the separator 3, the synthesized code information H, which is transmitted from the synthesizer 2, is input as an address to a ROM (not shown in FIG. 4) having a (reverse) conversion table stored, whose input-output relation is contrary to that of the synthesizer 2. That is, the ROM reads out a combination of code information A1 and $A_2$ corresponding to the synthesized code information H from the conversion table.

Thus, just by using a memory device, the synthesis and separation operations can be performed at high speed, without need of circuits such as adders, subtracters, multipliers, dividers and registers.

Figure 7:
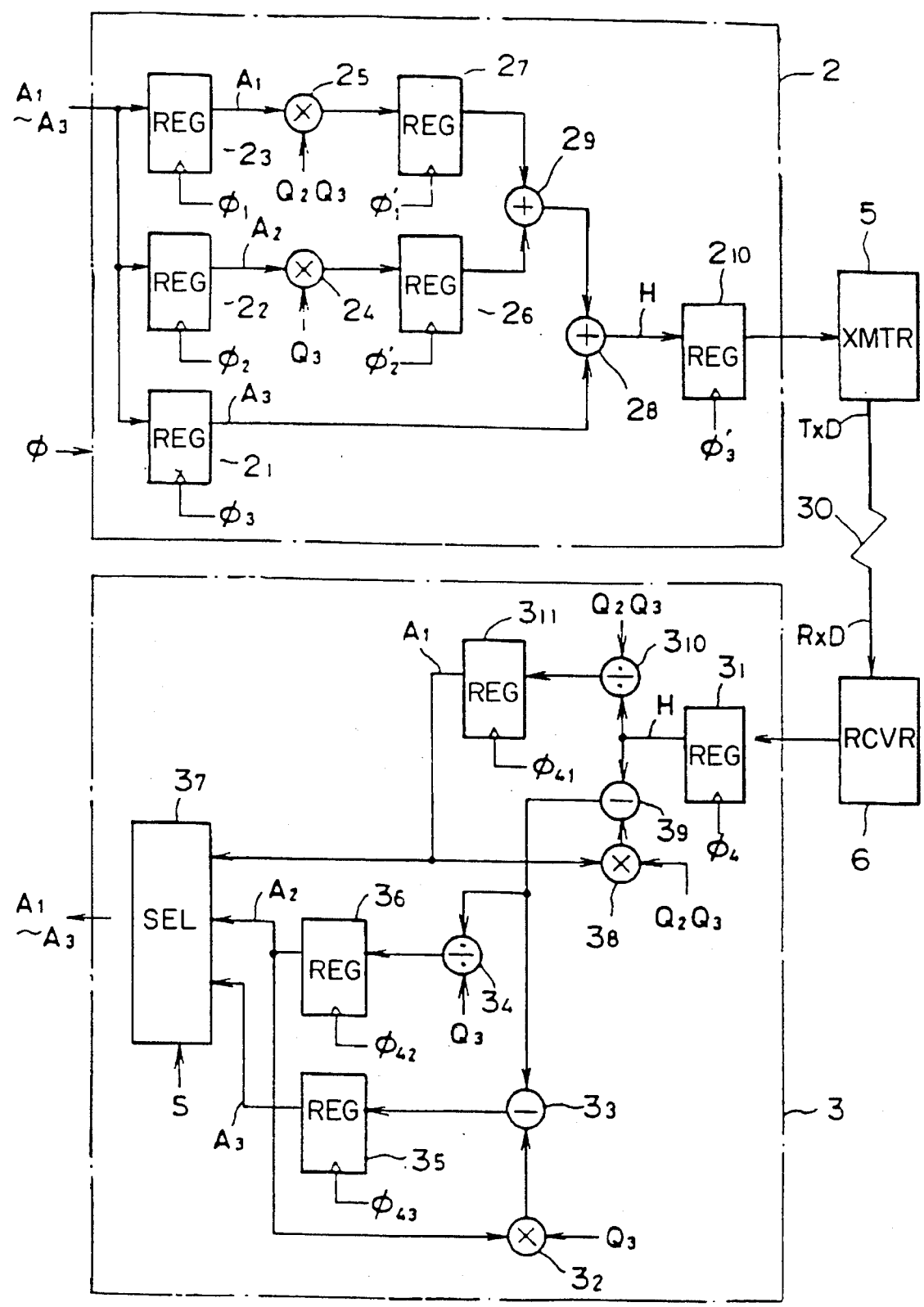
FIG. 7 illustrates a second embodiment of the invention in which the coder and decoder have respective code books and different sets of code vectors for use by the synthesizer and separator.

FIG. 7 is a block diagram illustrating a coding/decoding apparatus of the second embodiment of the present invention.

A synthesizer 2 is comprised of registers (abbreviated to REG) $2_1$–$2_3$, $2_6$, $2_7$ and $2_{10}$, multipliers $2_4$, $2_5$ and adders $2_8$, $2_9$. The separator 3 is comprised of registers $3_1$, $3_5$, $3_6$, $3_{11}$, multipliers $3_2$, $3_8$, subtracters $3_3$, $3_9$, dividers $3_4$, $3_{10}$ and selector (abbreviated to SEL) $3_7$.

In this example, $Q_1$ is 362 (a maximum integer equal to or less than $2^{X1}=2^{8.5}$), $Q_2$ is 630 (a maximum integer equal to or less than $2^{X2}=2^{9.3}$) and $Q_3$ is 294 (a maximum integer equal to or less than $2^{X3}=2^{8.2}$).

In the synthesizer 2, the first code information $A_1$ generated by the coder 1 is loaded into the register $2_3$ with a clock pulse $\phi_1$ which occurs in synchronization with generation of the code information $A_1$. Then, the multiplier $2_5$ multiplies the output ($A_1$) of the register $2_3$ by ($Q_2 \times Q_3$). The multiplication result ($A_1 \times Q_2 \times Q_3$) is loaded into register $2_7$ with a clock pulse $\phi_1'$ which occurs following the clock pulse $\phi_1$.

The next code information $A_2$ generated by the coder 1 is loaded into the register $2_2$ with a clock pulse $\phi_2$ which occurs in synchronization with generation of the code information $A_2$. Then, the the multiplier $2_4$ multiplies the output ($A_2$) of the register $2_2$ by $Q_3$. The multiplication result ($A_2 \times Q_3$) is loaded into register $2_6$ with a clock pulse $\phi_2'$ which occurs following the clock pulse $\phi_2$. The adder $2_9$ adds the output ($A_1 \times Q_2 \times Q_3$) of the register $2_7$ to the output ($A_2 \times Q_3$) of the register $2_6$, to obtain $A_1 \times Q_2 \times Q_3 + A_2 \times Q_3$.

The following code information $A_3$ generated by the coder 1 is loaded into the register $2_1$ with a clock pulse $\phi_3$ which occurs in synchronization with generation of the code information $A_3$. Then, the adder $2_8$ adds the output ($A_1 \times Q_2 \times Q_3 + A_2 \times Q_3$) of the adder $2_9$ to the output ($A_3$) of the register $2_1$. The addition result ($A_1 \times Q_2 \times Q_3 + A_2 \times Q_3 + A_3$) is loaded into the register $2_{10}$ with a clock pulse $\phi_3'$ following the clock pulse $\phi_3$, and the output of the register $2_{10}$ is sent to the transmitter 5 as synthesized code information H. Thereafter, when another group of code information $A_1$, $A_2$ and $A_3$ are input, the above operations are repeated.

In the separator 3, the synthesized code information H input via the receiver 6 is loaded into the register $3_1$ with a clock pulse $\phi_4$ which occurs in synchronization with the input of the code H. The divider $3_{10}$ divides the output (H) of the register $3_1$ by ($Q_2 \times Q_3$). The quotient $A_1$ of the division result (with the decimal fractions of the quotient truncated) is loaded into the register $3_{11}$ with a clock pulse $\phi_{41}$ following the clock pulse $\phi_4$.

Then, the multiplier $3_8$ multiplies the output ($A_1$) of the register $3_{11}$ by ($Q_2 \times Q_3$). The subtracter $3_9$ subtracts the output ($A_1 \times Q_2 \times Q_3$) of the multiplier $3_8$ from the output (H) of the the register $3_1$.

The divider $3_4$ divides the output (H–$A_1 \times Q_2 \times Q_3$) of the subtracter $3_9$ by $Q_3$. The quotient $A_2$ of the division result (with the decimal fractions of the quotient truncated) is loaded into register $3_6$ with a clock pulse $\phi_{42}$ following the clock pulse $\phi_{41}$. The multiplier $3_2$ multiplies the output ($A_2$) of the register $3_6$ by $Q_3$ to obtain $A_2 \times Q_3$.

The subtracter 33 subtracts the output ($A_2 \times Q_3$) of the multiplier $3_2$ from the output (H–$A_1 \times Q_2 \times Q_3$) of the subtracter $3_9$ to obtain $A_3$. The subtraction result $A_3$ is loaded into register $3_5$ with a clock pulse $\phi_{43}$ following the clock pulse $\phi_{42}$. The selector $3_7$ selects the thus-separated code information $A_1$, $A_2$, and $A_3$ by using a selection signal S which occurs in synchronization with the above decoding operation by the decoder 4 and supplies the $A_1$, $A_2$ and $A_3$ sequentially to the decoder 4. Thus, the synthesized code information is separated into the original code information $A_1$, $A_2$ and $A_3$. Thereafter, every time the synthesized code H is input, the above operations are repeated.

This example of the code information synthesis/separation method is suited for a system in which the coder 1 and decoder 4 have respective code books $1_1$ and $4_1$, each of which has three different sets including $Q_1$, $Q_2$ and $Q_3$ code vectors, for selective use by the synthesizer 2 and separator 3.

Figure 8:
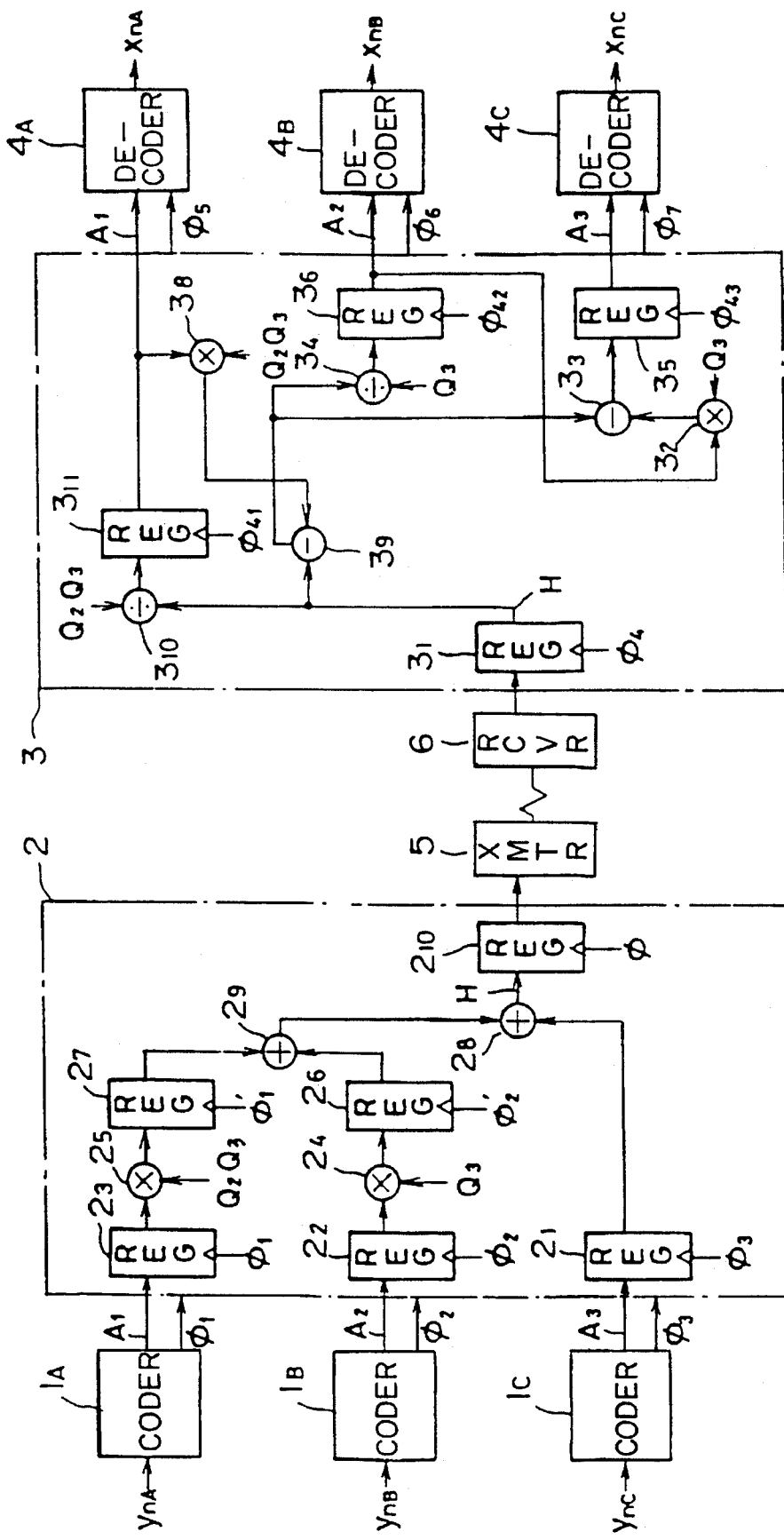
FIG. 8 illustrates, in greater detail, the operation of a synthesizer and a separator according to a third embodiment of the invention.

FIG. 8 is a block diagram illustrating a coding/decoding apparatus of the third embodiment of the present invention.

A coder $1_A$–$1_c$ have respective code books $1_{1A}$, $1_{1B}$ and $1_{1c}$ (not shown), each including $Q_1$, $Q_2$ and $Q_3$ code vectors, respectively. A synthesizer 2 synthesizes (i.e., time-division multiplexes) code information $A_1$–$A_3$ output from the coders $1_A$–$1_c$ into synthesized code information H in the same way as described above, and transmits the H to a transmission line via a transmitter 5.

A separator 3 separates (or demultiplexes) the synthesized code information H, which is input thereto via a receiver 3, into the original code information $A_1$–$A_3$ in the same way as described above, and outputs the information $A_1$–$A_3$ to decoders $4_A$–$4_c$, respectively. The decoders $4_A$–$4_c$, corresponding to the coder $1_A$–$1_c$, respectively, have respective code books $4_{1A}$, $4_{1B}$ and $4_{1c}$ (not shown).

Figure 9:
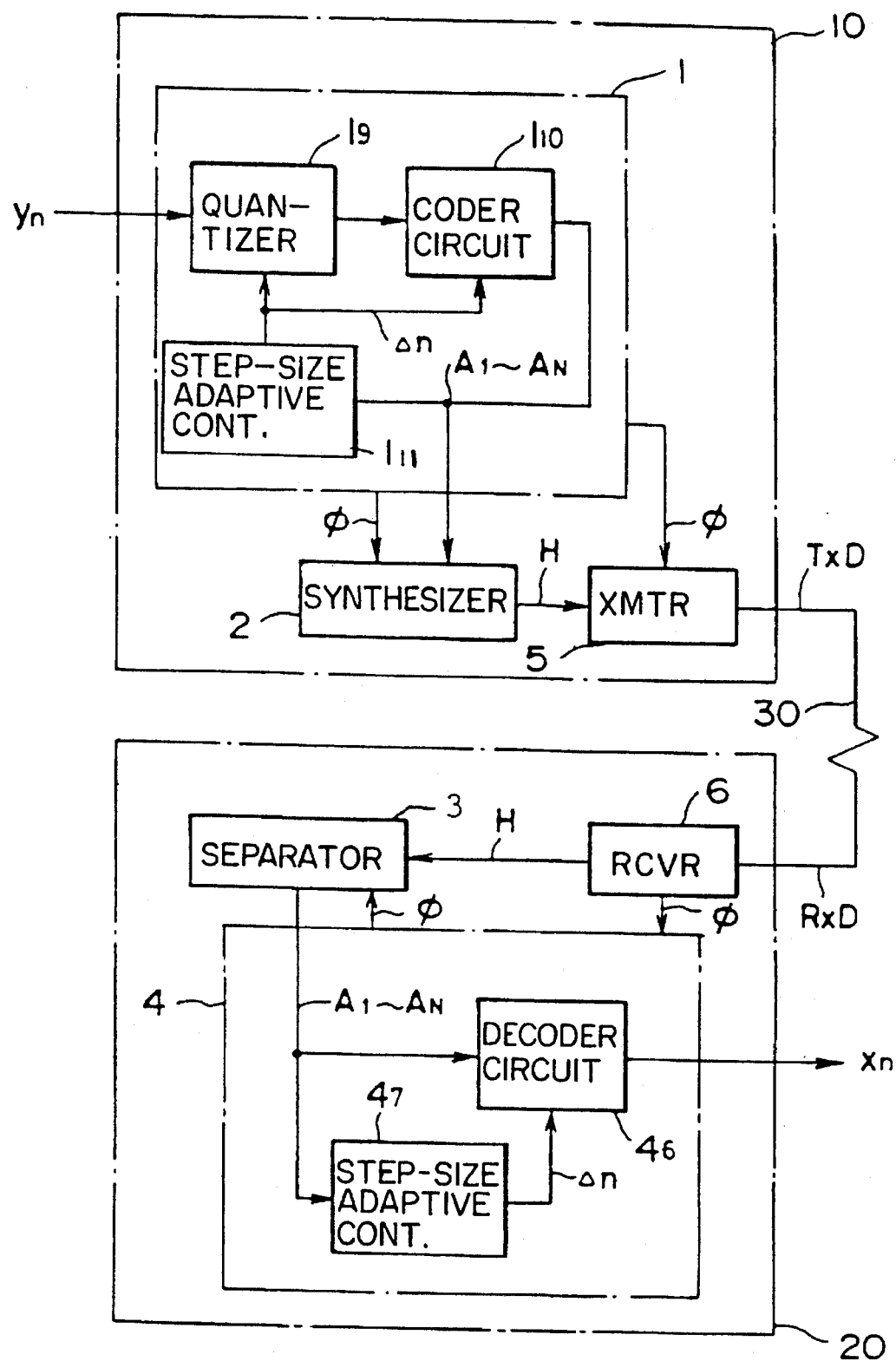
FIG. 9 illustrates a fourth embodiment of the invention using a scalar quantization method.

FIG. 9 is a block diagram illustrating a coding/decoding apparatus of the fourth embodiment of the present invention. An example of coding/decoding a speech signal by using the scalar quantization method is shown here.

A coding device 10 is comprised of a coder 1, a synthesizer 2 which has a construction similar to that of FIG. 4, and a transmitter 5. The coder 1 is comprised of a quantizer $1_9$, a coder circuit $1_{10}$ and a step-size adaptive controller $1_{11}$. A decoding device 20 is comprised of a receiver 6, a separator 3 and a decoder 4 which has a construction similar to that of FIG. 4. The decoder 4 is comprised of a decoder circuit $4_6$ and a step-size adaptive controller $4_7$.

In the coding device 10, the quantizer $1_9$ scalar-quantizes an input speech signal $y_n$ into any of Q (e.g., 362) quantization points according to quantization width $\Delta_n$ explained below. According to the thus-quantized quantization point, the coder circuit $1_{10}$ generates code information A including the quantization width $\Delta_n$. Based on previous code information A, the step-size adaptive controller $1_{11}$ determines a quantization width $\Delta_n$ which minimizes a quantization error caused by the quantizer $1_9$ and outputs the thus-determined quantization width $\Delta_n$ to the quantizer $1_9$ and coder circuit $1_{10}$. The synthesizer 2 synthesizes N sets of code information $A_1$–$A_N$ into a synthesized code information H and transmits it over the transmission line 30 via the transmitter 5.

In the decoding device 20, the separator 3 separates the synthesized code information H input via the receiver 6, into the original code information $A_1$–$A_N$. According to the quantization width $\Delta_1$–$\Delta_N$ included in the separated code information $A_1$–$A_N$, respectively, the decoder 4 reproduces (or reversely scalar-quantizes) each of code information $A_1$–$A_N$ into one of Q (e.g., 362) speech signal levels $x_n$.

Although the synthesizer 2 and the separator 3 are explained as constructed with hardware in the above example, their functions may be realized with software using a code conversion table as shown in FIG. 6.

Moreover, although the vector-quantization and scalar-quantization method are taken as examples in the above description, the present invention can be applied to any other coding/decoding methods.

In the above examples, N, which is the number of code information to be synthesized, is explained as a number satisfying that N×Y is an integer 1 (where Y is a decimal fraction of the average number of code-information bits required for expressing the whole quantization points, e.g., N is 2 and Y is the decimal fraction 0.5 of 8.5 in the first embodiment). However, N may be any number which satisfies desirably that N×Y is an integer 2 or more. (Broadly, N×Y need not be an integer). Similarly, N is explained as a number satisfying that the aggregate of $Y_1$–$Y_N$ is an integer 1 (where $Y_1$–$Y_N$ are decimal fractions of $X_1$–$X_N$ respectively, which are the average numbers of code-information bits required for expressing the whole of the respective quantization points, e.g., $X_1$–$X_N$ are 8.5, 9.3 and 8.2; and $Y_1$–$Y_N$ are 0.5, 0.3 and 0.2 in the second embodiment). However, N may be any number which satisfies desirably that the aggregate of $Y_1$–$Y_N$ is an integer 2 or more. (Broadly, the aggregate need not be an integer.)

Furthermore, although coding/decoding of speech signals is taken as examples in the above description, the present invention can be applied to coding/decoding of any other signals including image signals.

As is apparent from the above description, the present invention can always achieve optimized coding/decoding by increasing the entries of the code book and utilize such system resources as transmission line and external memory, most effectively and efficiently. Moreover, since the a coding/decoding apparatus and method of the present invention is so constructed as described above, it can be realized with a small amount of circuitry or program and therefore, at low cost.

What is claimed is:

1. A coding apparatus comprising:

generation means, responsive to an input signal input to said coding apparatus, for generating N sets of code information $A_1$–$A_N$, each representing one of Q quantization points of the input signal,
wherein Q is an integer equal to or less than $2^X$, and X is a positive number;

synthesis means for synthesizing the code information $A_1$–$A_N$ into a synthesized code H through an operation:

$$H = A_1 Q^{N-1} + A_2 Q^{N-2} + \ldots + A_{N-1} Q + A_N; \text{ and}$$

output means for outputting the synthesized code H.

2. A decoding apparatus comprising:

input means for inputting a synthesized code H synthesized through an operation:

$$H = A_1 Q^{N-1} + A_2 Q^{N-2} + \ldots + A_{N-1} Q + A_N,$$

wherein $A_1$–$A_N$ are N sets of code information, each representing one of Q quantization points, Q is an integer equal to or less than $2^X$, X is a positive number;

separation means for separating the synthesized code H into N sets of code information $A_1$–$A_N$ through following operations with decimal fractions of quotients truncated:

$$A_1 = H/Q^{N-1}$$

$$A_2 = (H - A_1 Q^{N-1})/Q^{N-2}$$

.
.
.

$$A_{N-1} = (H - A_1 Q^{N-1} - A_2 Q^{N-2} - \ldots - A_{N-2} Q^2)/Q$$

$$A_N = H - A_1 Q^{N-1} - A_2 Q^{N-2} - \ldots - A_{N-2} Q^2 - A_{N-1} Q; \text{ and}$$

reproduction means for reproducing an output signal based upon the code information $A_1$–$A_N$ separated.

3. A coding apparatus comprising:

generation means, responsive to an input signal input to said coding apparatus, for generating N sets of code information $A_1$–$A_N$, each representing one of Q quantization points of the input signal with Z bits,
wherein Q is the maximum integer of numbers $2^X$ or less, X is a positive decimal whose decimal fraction multiplied by N is an integer and Z is the minimum integer of numbers more than X;

synthesis means for synthesizing the code information $A_1$–$A_N$ into a P-bit synthesized code H through an operation:

$$H = A_1 Q^{N-1} + A_2 Q^{N-2} + \ldots + A_{N-1} Q + A_N,$$

wherein P = X×N; and output means for outputting the synthesized code H.

4. A coding apparatus according to claim 3, wherein said generation means comprises:

storage means for storing the code information $A_1$–$A_N$ corresponding to signal patterns of the input signal; and coding control means for searching said storage means for the signal pattern close to the input signal and for generating the code information $A_1$–$A_N$ corresponding to the signal pattern found.

5. A coding apparatus according to claim 3, wherein said synthesis means includes storage means which stores the operation results H for combinations of $A_1$–$A_N$ and performs the synthesis on reference to said storage means.

6. A coding apparatus according to claim 4, wherein said coding control means generates the code information $A_1$–$A_N$ by performing a quantization on the input signal, which quantization includes vector-quantization and scalar-quantization methods.

7. A decoding apparatus comprising:

input means for inputting a P-bit synthesized code H synthesized through an operation:

$$H = A_1 Q^{N-1} + A_2 Q^{N-2} + \ldots + A_{N-1} Q + A_N,$$

wherein $A_1$–$A_N$ are N sets of code information, each representing one of Q quantization points, Q is the maximum integer of numbers $2^X$ or less, X is a positive decimal whose decimal fraction multiplied by N is an integer and P = X×N;

separation means for separating the synthesized code H into

N sets of Z-bit code information $A_1$–$A_N$ through following operations with decimal fractions of quotients truncated:

$$A_1 = H/Q^{N-1}$$

$$A_2 = (H - A_1 Q^{N-1})/Q^{N-2}$$

.
.
.

$$A_{N-1} = (H - A_1 Q^{N-1} - A_2 Q^{N-2} - \ldots - A_{N-2} Q^2)/Q$$

$$A_N = H - A_1 Q^{N-1} - A_2 Q^{N-2} - \ldots - A_{N-2} Q^2 - A_{N-1} Q,$$

wherein Z is the minimum integer of numbers more than X; and reproduction means for reproducing an output signal based upon the code information $A_1$–$A_N$ separated.

8. A decoding apparatus according to claim 7, wherein said reproduction means comprises:

storage means for storing signal patterns corresponding to the code information $A_1$–$A_N$; and decoding control means for searching said storage means for the signal pattern corresponding to the code information $A_1$–$A_N$ and for reproducing an output signal based upon the signal pattern found.

9. A decoding apparatus according to claim 7, wherein said separation means includes storage means which stores the operation results $A_1$–$A_N$ for H and performs the separation on reference to said storage means.

10. A coding apparatus comprising:

generation means, responsive to input signals input to said coding apparatus, for generating N sets of code information $A_1$–$A_N$ which represent a maximum of $Q_1$–$Q_N$ quantization points of the input signals with $Z_1$–$Z_N$ bits respectively, wherein $Q_1$–$Q_N$ are the maximum integers of numbers $2^{X_1}$–$2^{X_N}$ or less respectively, $X_1$–$X_N$ are positive decimals whose decimal fractions totaled is an integer and $Z_1$–$Z_N$ are the minimum integers of numbers more than $X_1$–$X_N$ respectively;

synthesis means for synthesizing the code information $A_1$–$A_N$ into a P-bit synthesized code H through an operation:

$$H = A_1 Q_2 Q_3 \ldots Q_N + A_2 Q_3 Q_4 \ldots Q_N + \ldots + A_{N-1} Q_N + A_N,$$

wherein $P = X_1 + X_2 + \ldots + X_N$; and output means for outputting the synthesized code H.

11. A decoding apparatus comprising:

input means for inputting a P-bit synthesized code H synthesized through an operation:

$$H = A_1 Q_2 Q_3 \ldots Q_N + A_2 Q_3 Q_4 \ldots Q_N + \ldots + A_{N-1} Q_N + A_N, \text{ wherein}$$

$A_1$–$A_N$ are N sets of code information which represent a maximum of $Q_1$–$Q_N$ quantization points respectively, $Q_1$–$Q_N$ are the maximum integers of numbers $2^{X_1}$–$2^{X_N}$ or less respectively, $X_1$–$X_N$ are positive decimals whose decimal fractions totaled is an integer, and $P = X_1 + X_2 + \ldots + X_N$;

separation means for separating the synthesized code H into N sets of code information $A_1$–$A_N$ including $Z_1$–$Z_N$ bits respectively, through following operations with decimal fractions of quotients truncated:

$$A_1 = H / Q_2 Q_3 \ldots Q_N$$

$$A_2 = (H - A_1 Q_2 Q_3 \ldots Q_N) / Q_3 Q_4 \ldots Q_N$$

.
.
.

$$A_{N-1} = (H - A_1 Q_2 Q_3 \ldots Q_N - A_2 Q_3 Q_4 \ldots Q_N - \ldots - A_{N-2} Q_{N-1} Q_N) / Q_N$$

$$A_N = H - A_1 Q_2 Q_3 \ldots Q_N - A_2 Q_3 Q_4 \ldots Q_N - \ldots - A_{N-2} Q_{N-1} Q_N - A_{N-1} Q_N,$$

wherein $Z_1$–$Z_N$ are the minimum integers of numbers more than $X_1$–$X_N$ respectively; and reproduction means for reproducing output signals based upon the code information $A_1$–$A_N$ separated.

12. A coding/decoding method comprising the steps of:

(a) generating N sets of code information $A_1$–$A_N$, each representing one of Q quantization points of an input signal with Z bits, wherein Q is the maximum integer of numbers $2^X$ or less, X is a positive decimal whose decimal fraction multiplied by N is an integer and Z is the minimum integer of numbers more than X;

(b) synthesizing the code information $A_1$–$A_N$ into a P-bit synthesized code H through an operation:

$$H = A_1 Q^{N-1} + A_2 Q^{N-2} + \ldots + A_{N-1} Q + A_N,$$

wherein $P = X \times N$;

(c) outputting the synthesized code H;

(d) inputting the P-bit synthesized code H synthesized in step (c);

(e) separating the synthesized code H into N sets of Z-bit code information $A_1$–$A_N$ through following operations with decimal fractions of quotients truncated:

$$A_1 = H / Q^{N-1}$$

$$A_2 = (H - A_1 Q^{N-1}) / Q^{N-2}$$

.
.
.

$$A_{N-1} = (H - A_1 Q^{N-1} - A_2 Q^{N-2} - \ldots - A_{N-2} Q^2) / Q$$

$$A_N = H - A_1 Q^{N-1} - A_2 Q^{N-2} - \ldots - A_{N-2} Q^2 - A_{N-1} Q,$$

wherein Z is the minimum integer of numbers more than X; and (f) reproducing an output signal based upon the code information $A_1$–$A_N$ separated.

13. A coding/decoding method according to claim 12, wherein said synthesizing in step (b) comprises the steps of:

(g) storing the operation results H for combinations of $A_1$–$A_N$ in storage means; and (h) performing the synthesis on reference to the storage means.

14. A coding/decoding method according to claim 12, wherein said separating in step (e) comprises the steps of:

(i) storing the operation results $A_1$–$A_N$ for H in storage means; and (j) performing the separation on reference to the storage means.

* * * * *